(12) United States Patent
Takayanagi (10) Patent No.: US 8,766,704 B2
(45) Date of Patent: Jul. 1, 2014

(54) ADAPTIVE VOLTAGE ADJUSTMENT BASED ON TEMPERATURE VALUE

(75) Inventor: Toshinari Takayanagi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/604,199

(22) Filed: Sep. 5, 2012

(65) Prior Publication Data

US 2014/0062533 A1 Mar. 6, 2014

(51) Int. Cl.
*H01L 35/00* (2006.01)

(52) U.S. Cl.
USPC ........................................................ 327/513

(58) Field of Classification Search
CPC ........... G05F 1/46; G05F 1/567; G05F 3/222; G05F 3/225; G05F 3/242; G05F 3/245
USPC .................. 327/512, 513, 540, 541, 545, 546
See application file for complete search history.

(56) References Cited

U.S. PATENT DOCUMENTS

| | | | |
|---|---|---|---|
| 6,535,013 B2 * | 3/2003 | Samaan | 324/750.3 |
| 6,789,037 B2 | 9/2004 | Gunther et al. | |
| 6,996,491 B2 * | 2/2006 | Gold et al. | 702/132 |
| 7,149,645 B2 * | 12/2006 | Mangrulkar et al. | 702/130 |
| 7,321,254 B2 * | 1/2008 | Li et al. | 327/534 |
| 7,777,554 B2 * | 8/2010 | Hirano | 327/512 |
| 7,852,138 B2 * | 12/2010 | Kuusilinna et al. | 327/513 |
| 7,962,887 B2 | 6/2011 | Anderson et al. | |
| 8,130,024 B2 * | 3/2012 | Zimlich | 327/512 |
| 2004/0264093 A1 | 12/2004 | Boerstler et al. | |
| 2005/0188230 A1 | 8/2005 | Bilak | |
| 2006/0265174 A1 * | 11/2006 | Doyle et al. | 702/130 |
| 2009/0322409 A1 | 12/2009 | Levit et al. | |
| 2010/0109757 A1 | 5/2010 | Wiatr et al. | |
| 2010/0213919 A1 | 8/2010 | Takayanagi et al. | |
| 2012/0119777 A1 | 5/2012 | Von Kaenel | |

OTHER PUBLICATIONS

International Search Report and Written Opinion from PCT/US2013/058009, dated Sep. 4, 2013, Apple Inc., pp. 1-10.

* cited by examiner

*Primary Examiner* — Jeffrey Zweizig
(74) *Attorney, Agent, or Firm* — Lawrence J. Merkel; Erik A. Heter; Meyertons, Hood, Kivlin, Kowert & Goetzel, P.C.

(57) ABSTRACT

Various embodiments of a method and apparatus for performing adaptive voltage adjustment based on temperature value are disclosed. In one embodiment, and integrated circuit (IC) includes logic circuitry having at least one temperature sensor therein. The IC also includes a power management circuit coupled to receive temperature readings from the temperature sensor. The power management circuit is configured to determine a temperature of the IC based on a temperature reading received from the temperature sensor. The power management circuit may compare the determined temperature to a temperature threshold. If the temperature exceeds a temperature threshold value, the power management circuit may cause the operating voltage to be reduced by an amount equivalent to a voltage guard band.

21 Claims, 5 Drawing Sheets

ADAPTIVE VOLTAGE ADJUSTMENT BASED ON TEMPERATURE VALUE

BACKGROUND

1. Technical Field

This disclosure is directed to electronic circuits, and more particularly, to supply voltage adjustments based on reported temperature values.

2. Description of the Related Art

Advances in integrated circuit (IC) technology have increased the number of transistors on a single IC chip. The operating frequencies of some IC chips has also increased. The large number of transistors and increase in operating frequency has resulted in a corresponding increase in power consumption by IC chips. A corresponding increase in thermal output has also accompanied the increase in transistor count and operating frequency.

Management of power consumption and thermal output has increase in importance with the above-mentioned advances in IC technology. This is particularly true for portable devices that may rely on a battery for at least some of their operation. One manner in which power may be saved is to reduce the operating voltage of an IC. The power consumption by a given IC can be calculated as the square of the operating voltage. Accordingly, reduction of the operating voltage can have a significant impact on power consumption. However, ability to reduce the operating voltage may nevertheless be limited. Circuits within a given IC typically need a certain amount of voltage to operate properly. Furthermore, the operating voltage may include a guard band that is a surplus voltage added to the required voltage. The guard band may allow for factors such as power supply noise, as well as for process, voltage, and temperature variations while ensuring that circuit internal to the IC receive sufficient voltage for proper operation.

SUMMARY

Various embodiments of a method and apparatus for performing adaptive voltage adjustment based on temperature value are disclosed. In one embodiment, and integrated circuit (IC) includes logic circuitry having at least one temperature sensor therein. The IC also includes a power management circuit coupled to receive temperature readings from the temperature sensor. The power management circuit is configured to determine a temperature of the IC based on a temperature reading received from the temperature sensor. The power management circuit may compare the determined temperature to a temperature threshold. If the temperature exceeds a temperature threshold value, the power management circuit may cause the operating voltage to be reduced by an amount equivalent to a voltage guard band.

In one embodiment, a power management circuit may compare a determined temperature of the IC to a temperature value that is equivalent to the temperature at which a production test of the IC was performed. The production test is also performed at a first voltage. For temperatures below the temperature threshold, the IC may operate at an operating voltage that is a sum of the first voltage and a guard band voltage. The additional guard band voltage may be provided to ensure a sufficient operating voltage by the circuits in that power domain. If the temperature is determined to be above the temperature threshold, then the operating voltage may be reduced by the guard band voltage, effectively removing the guard band. This may be possible since, based on the production test, it is known that the IC may properly function at the first voltage (i.e., without the guard band voltage) at that particular temperature. In some embodiments, an additional temperature guard band may be added to the production test temperature.

While the discussion above has been directed to an IC as a whole, the method and apparatus embodiments may be applied more particularly to particular power domains in an IC that implement multiple power domains. The other power domains may or may not implement the same methodology, depending on other factors such as their operating requirements.

Since the power management circuit in one embodiment may base decisions on whether a temperature is above or below the value at which production test occurred (or a threshold based on that temperature), the design of the temperature sensors may be simplified. Embodiments using ring oscillators or various diode-based designs to implement the temperature sensors are possible and contemplated.

In some embodiments, the methodology may be extended to temperatures other than that at which production test occurred. For example, in one embodiment a power management circuit may compare a temperature value to a threshold that is less than the threshold based on the production test value. If the temperature is greater than the lower threshold value but less than the greater threshold value (upon which production test was based), the operating voltage may be reduced by a portion (but not the full amount) of the guard band. In general, the methodology described herein may take advantage of the fact that at higher temperatures, lower operating voltages may be used in some cases.

BRIEF DESCRIPTION OF THE DRAWINGS

The following detailed description makes reference to the accompanying drawings, which are now briefly described.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Figure 1:
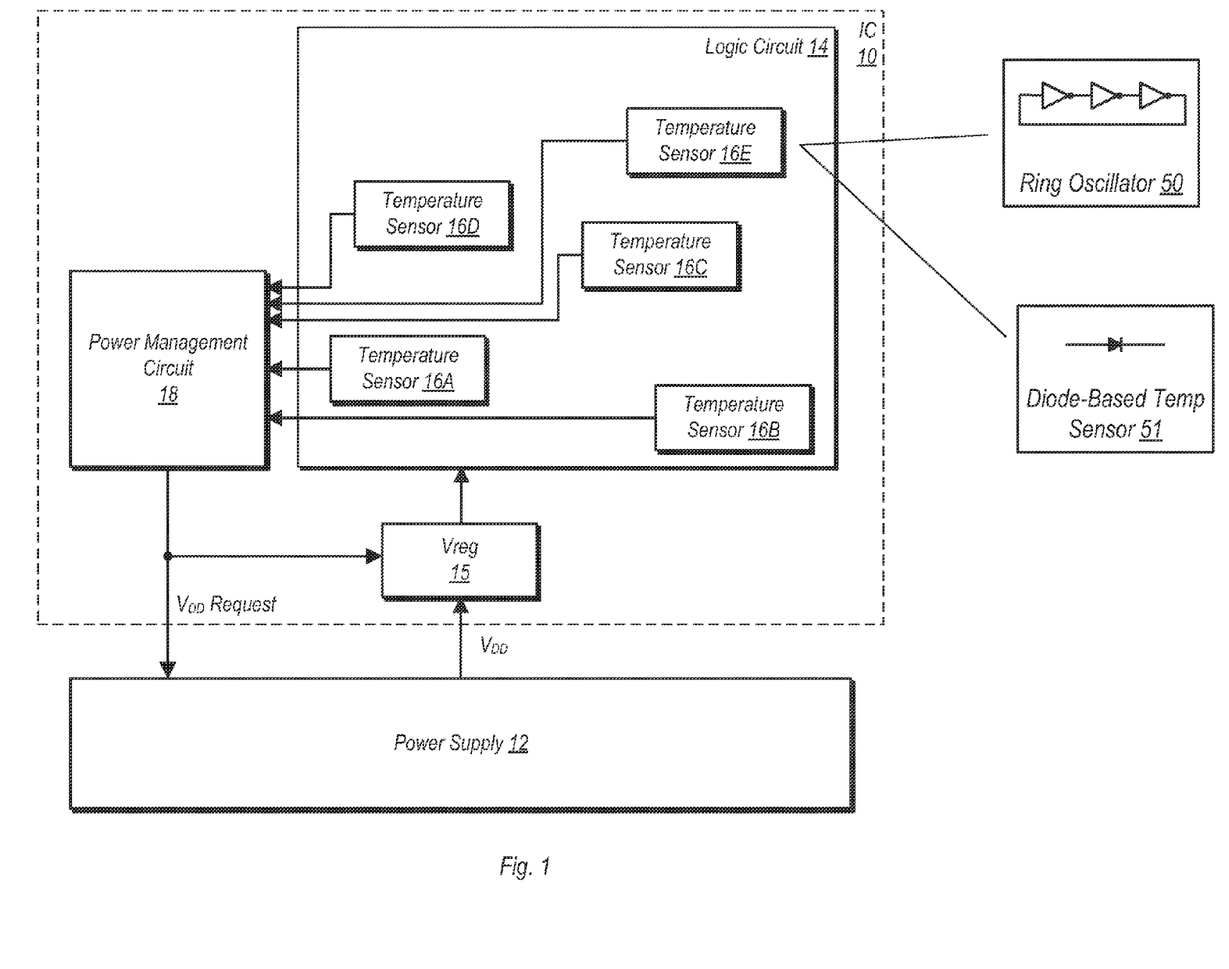
FIG. 1 is a block diagram of one embodiment of an integrated circuit (IC).

Turning now to FIG. 1, a block diagram of one embodiment of an integrated circuit (IC) is shown. In the illustrated embodiment, IC 10 includes a logic circuit 14 having a number of temperature sensors 16A-16E implemented therein. The number of temperature sensors may vary from one embodiment to the next, with as few as one being implemented. Although not explicitly shown, logic circuit 14 may also include a number of different types of combinational and/or sequential logic circuits and functional units implemented therein to perform various function of IC 10. Furthermore, although not explicitly shown, IC 10 in various embodiments may include additional instances of logic circuit 14, which may be identical in some cases or may be different in other cases. Furthermore, additional instances of logic circuit 14 may be in the same power domain as that which is shown here, or may be in a different power domain.

Each of temperature sensors 16A-16E in the embodiment shown is coupled to provide temperature readings to power management circuit 18. The temperature sensors shown herein may be implemented using relatively simple circuits. In one embodiment, temperature sensors 16A-16E may be implemented as ring oscillator-based temperature sensors 50. In another embodiment, temperature sensors 16A-16E may be implemented as diode-based temperature sensors 51. In either case, the methodology discussed below may allow for temperature sensors to be implemented using simplified circuits, as accuracy across a wide range of temperatures may not be required.

Power management circuit 18 in the embodiment shown is configured to determine a temperature of IC 10, or at least a temperature of logic circuit 14, based on temperature readings received from the various temperature sensors 16A-16E. The temperature may be determined in various ways. In one embodiment, a temperature may be determined based on a reading at an extreme, e.g., the highest or lowest temperature reported. In another embodiment, power management circuit 18 may determine an average of all of the temperatures reported from the various temperature sensors 16A-16E.

Power management circuit 18 in the embodiment shown is coupled to a voltage regulator 15 that is on-board IC 10. Additionally, power management circuit 18 in the embodiment shown is also coupled to power supply 12, which is external to IC 10. In this example embodiment, power management circuit 18 may control the operating voltage received by logic circuit 14 through either power supply 12 or through voltage regulator 15. In some embodiments, power management circuit 18 may be coupled to control the operating voltage only through voltage regulator 15 or through power supply 12, exclusive of one another. Regardless of how the operating voltage is controlled, power management circuit 18 may generate signals indicative of a desired operating voltage that may be received by voltage regulator 15 and/or power supply 12.

In various embodiments, an operating voltage provided to logic circuit 14 of IC 10 may include a guard band for at least some operating conditions. The guard band may be an additional voltage added to a minimum safe operating voltage to allow for noise on the power supply rails and so forth. The guard band voltage, when added to the minimum safe operating voltage, may allow for safe operation across a wide variety of conditions, including across a range of temperatures. In general, the minimum voltage at which an IC (or portions thereof) may operate may vary with temperature, with higher operating voltages provided for lower temperatures. Accordingly, in one embodiment, the guard band may be determined based on a minimum operating temperature and added on to a voltage at which a production test of IC 10 was conducted. The temperature at which the production test is conducted may be higher than the minimum temperature. In one exemplary embodiment, a production test may be conducted at a temperature of 25° C., while a minimum operating temperature may be designated at −25° C. Therefore, the guard band voltage may be added to the production test voltage such that logic circuit 14 of IC 10 may properly function at −25° C. It is noted that the specific temperature values given herein are exemplary, and that embodiments in which a guard band voltage is based on other temperatures are possible and contemplated.

Power management circuit 18 may cause adjustments to the operating voltage (increases or decreases) based on various parameters. One such parameter upon which power management circuit 12 may base decisions for operating voltage changes may be temperature values, as indicated by the various ones of temperature sensors 16A-16E. As noted above, power management circuit 18 is configured to provide various signals to either voltage regulator 15 or power supply 12 in order to cause changes to a correspondingly provided operating voltage.

In the embodiment shown, power management circuit 18 may compare determined temperature values for logic circuit 14 (or for IC 10 as a whole) to one or more thresholds and adjust the operating voltage based on such comparisons. In one embodiment, power management circuit 18 may compare a determined temperature to a first temperature threshold that is equivalent to temperature at which a production test of IC 10 was conducted. If the determined temperature exceeds the first temperature threshold, power management circuit 18 may respond by causing a reduction of the operating voltage by the guard band amount. This is made possible due to the fact that, since IC 10 successfully passed a production test passed at a certain voltage temperature without an added guard band, the voltage guard band is can be removed for temperatures above the production test temperature.

In some embodiments, for temperatures that are less than the first temperature threshold that is based on the production test temperature, portions of the guard band voltage may be eliminated. For example, in one embodiment, a second threshold temperature that is less than the first temperature threshold temperature may be implemented. If power management circuit 18 determines that the temperature of logic unit 14 is greater than the second temperature threshold, but less than the first temperature threshold, it may response by causing the operating voltage to be reduced by a portion of the guard band (but not by the full guard band amount).

Figure 2:
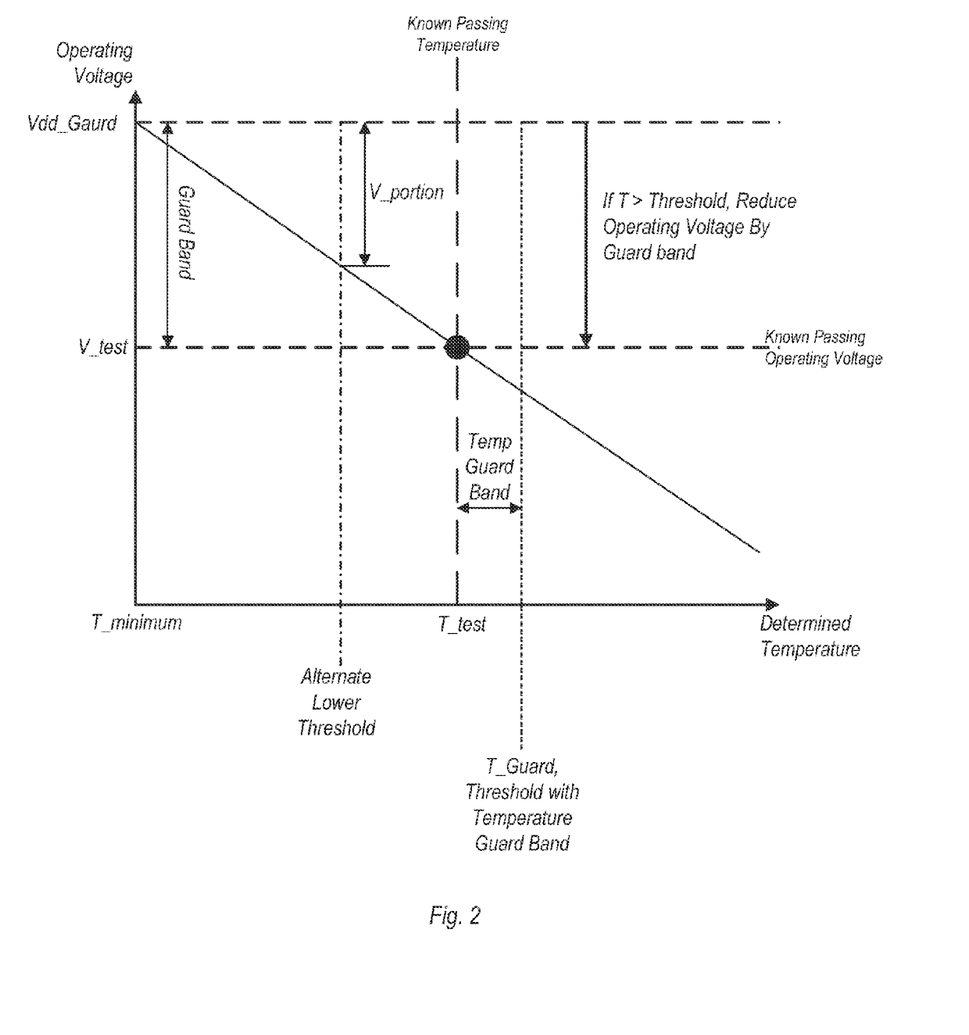
FIG. 2 is a graph illustrating operation of a power management circuit for one embodiment of an IC.

FIG. 2 is a graph further illustrating operation of at least one embodiment of a power management circuit 18 in terms of controlling an operating voltage based on determined temperature values. In the illustrated example, a temperature slope is drawn from an operating voltage, Vdd_Guard, corresponding to a temperature, T_minimum, through and operating voltage V_test, corresponding to a temperature T_test. In this example, V_test and T_test are production test operating voltage and temperature values, respectively (i.e. the values at which production test was conducted). Vdd_Guard in this example is an operating voltage that adds a guard band to V_test. The guard band may be determined by various types of characterization routines that are commonly conducted with an IC design after it has been committed to silicon.

One of two different temperature values may be used to implement a first temperature threshold as discussed above. In some embodiments of a power management circuit, T_test may be used as a first temperature threshold. Responsive to determining that the temperature is above T_test in such embodiments, power management circuit 18 may reduce the operating voltage from Vdd_Guard to V_test. This effectively removes the full guard band from the operating voltage.

In other embodiments, a temperature guard band may be added to T_test to form the first threshold at T_Guard. In such embodiments, power management circuit 18 may reduce the operating voltage from Vdd_Guard to V_test responsive to determining that the temperature exceeds T_Guard, thereby removing the entirety of the guard band from the operating voltage. The temperature guard band that is added to T_test to form T_Guard may account for inaccuracies in the temperature sensors used. Thus, additional simplification of the temperature sensors may be attained in such embodiments.

In general, reducing the operating voltage from Vdd_Guard by the full guard band amount in the embodiments discussed in the previous two paragraphs may take advantage of knowledge that IC 10 (and thus logic circuit 14) were known to function properly at T_test and V_test during the production test.

In some embodiments, the operating voltage provided to IC 10 and logic circuit 14 may be Vdd_Guard when the temperature is determined to be below the first threshold that is based on T_test. At such temperatures, the full guard band may provide protection against transients and/or noise occurring in the power distribution system of IC 10 and/or logic circuit 14. In other embodiments, some reduction of the operating voltage may be performed for at least some temperatures below the first threshold. In the illustrated example, an alternate lower threshold is also shown as a second threshold. In one embodiment, power management circuit 18 may reduce the operating voltage from Vdd_Guard by a value V_portion responsive to determining that the temperature exceeds the second threshold but is less than the first threshold. This may thus enable additional power saving even when the temperature is less than the first threshold that is based on T_test.

Embodiments are possible and contemplated in which further reductions to the operating voltage are obtainable in addition to those discussed above. For example, one embodiment contemplates a power management circuit in which a continuum of thresholds is implemented corresponding to the sloped line shown in FIG. 3. In such embodiments, the operating voltage may be reduced from Vdd_Guard by an amount corresponding to a point on the slope line. In such an embodiment, the reduction in operating voltage may increase proportionally with temperature. Thus, for many, if not all temperatures above T_minimum, the operating voltage may be reduced by at least some amount from Vdd_Guard. In some cases, another temperature guard band may be added as discussed above such that the continuum of thresholds begins at a temperature above the minimum temperature. Embodiments are also possible and contemplated in which reductions of operating voltage above and beyond the guard band are possible for temperatures above the first threshold.

Figure 3:
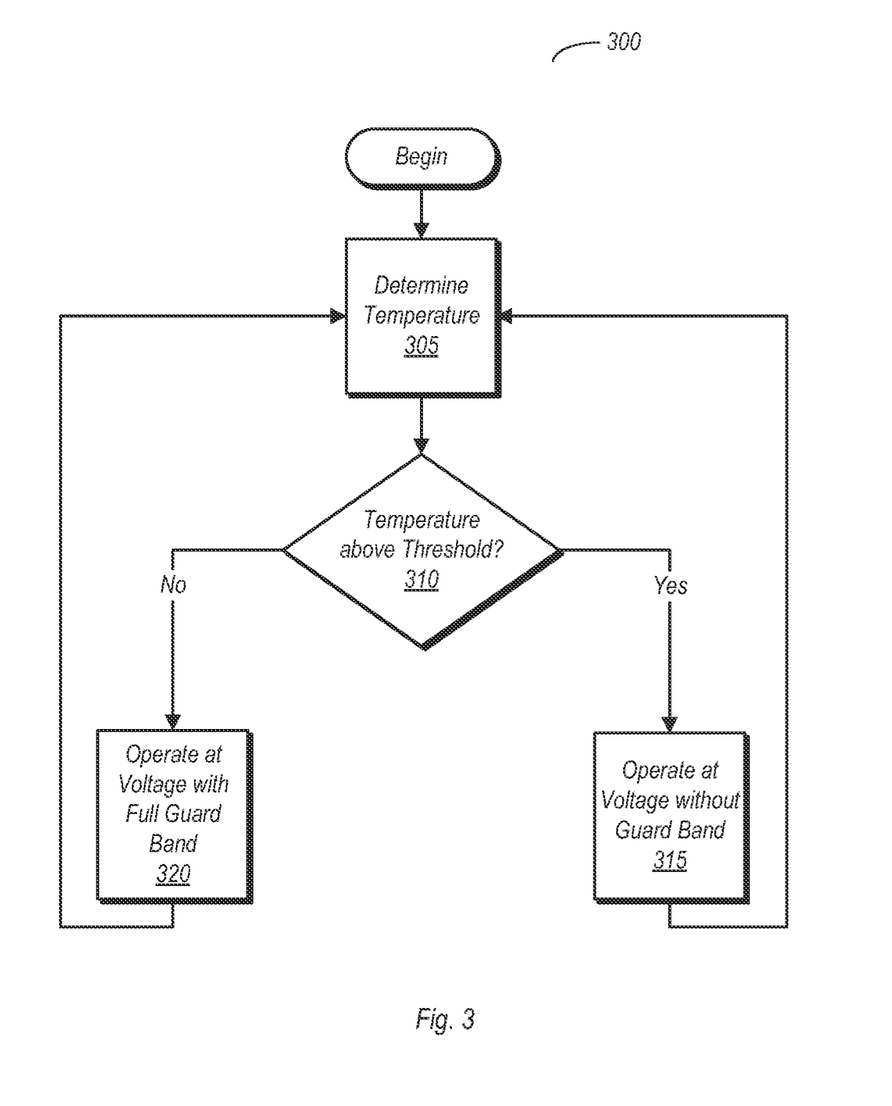
FIG. 3 is a flow diagram illustrating one embodiment of a method for controlling an operating voltage based on temperature.

FIG. 3 is a flow diagram illustrating one embodiment of a method for controlling an operating voltage based on temperature. Method 300 in the embodiment shown is a simplified method in which a single threshold is used as a basis for comparing temperatures to determine whether a guard band voltage is provided to an IC (or logic unit thereof).

Method 300 begins with the determining of a temperature of an IC or of a logic unit in a power domain thereof (block 305). The temperature may be determined based on one or more readings received from one or more corresponding temperature sensors. In cases in which multiple temperature sensors are used, the temperature may be determined based on a maximum reported temperature, a minimum reported temperature, or an average temperature.

Upon determining the temperature, a comparison may be made to a threshold value (block 310). In one embodiment, the threshold value may be a temperature at which a production test was performed on the IC. In another embodiment, the threshold may be a sum of the production test temperature and a guard band. The guard band may be added in some embodiments to compensate for inaccuracies in the temperature sensor(s), the methodology by which the temperature is determined, or both.

If the temperature is less than the threshold (block 310, no), the IC or logic unit thereof may be operated at a voltage that includes a full guard band (block 320). More particularly, the operating voltage in this case is a sum of the voltage at which the production test was conducted plus a guard band voltage. The added guard band voltage may ensure safe operation across a range of different temperatures down to at least a minimum temperature value, and may be based on chip characterization. Subsequent to block 320, the method may return to block 305.

If the temperature is determined to be greater than the threshold value (block 310, yes), then the IC or the logic circuit thereof may be operated at an operating voltage that does not include the guard band (block 315). More particularly, the operating voltage minus the guard band may be equivalent to a voltage at which a production test of the IC/logic circuit was conducted. Since the IC is presumed to have successfully completed the production test, the production test voltage may be assumed to be a safe operating voltage when the temperature of the IC is above the temperature threshold. Method 300 may return to block 305 following block 315. In general, temperature checks and comparisons may be performed periodically, with the operating voltage being adjusted accordingly.

Figure 4:
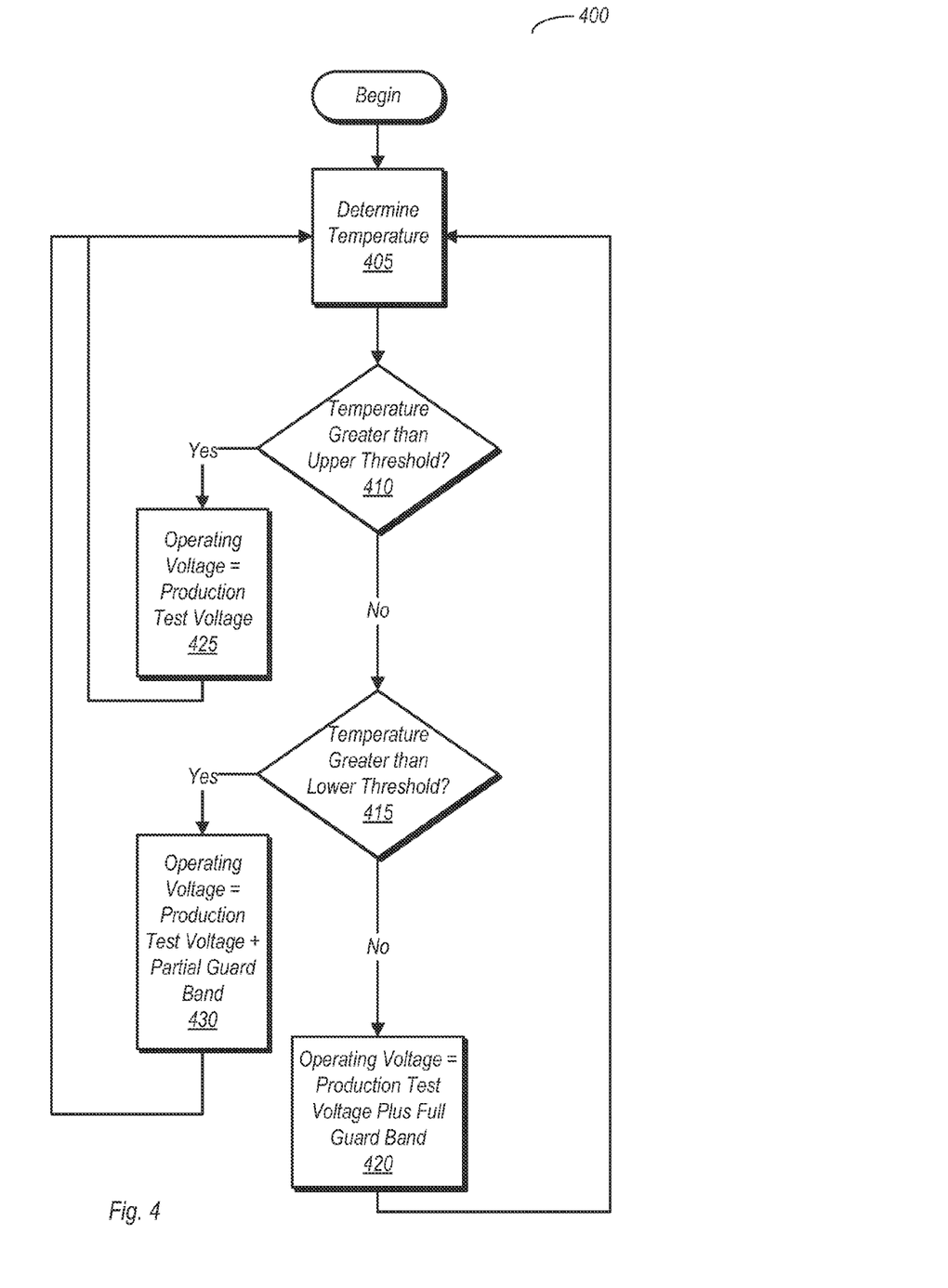
FIG. 4 is a flow diagram illustrating another embodiment of a method for controlling an operating voltage based on temperature.

FIG. 4 is a flow diagram of one embodiment of a method in which multiple temperature thresholds are used to determine an operating voltage for an IC or logic circuitry therein. In the embodiment shown, method 400 begins with the determination of a temperature of the IC/logic circuitry based on one or more readings received from temperature sensors (block 405). After determining the temperature, a comparison may be made to an upper temperature threshold value (block 410). If the temperature id greater than the upper threshold (block 410), a power management circuit may set the operating voltage to a value equal to a production test voltage (block 425). The method may then return to block 405 for another periodic temperature determination.

If the temperature is less than the upper temperature threshold (block 410, no), but is greater than a lower temperature threshold (block 415, yes), then the power management circuit may set the operating voltage to a sum of the production test voltage plus a partial guard band (block 430). The operating voltage may at this point be at an intermediate value between the production test voltage and the operating voltage that includes the full guard band. Method 400 may return to block 405 after block 430 for a subsequent periodic temperature determination.

If the temperature is less than the lower threshold (block 415, no), then the power management circuit may set the operating voltage to a value that is the sum of the production test voltage and the full guard band. Method 400 may then return to block 405 for another periodic temperature determination.

Figure 5:
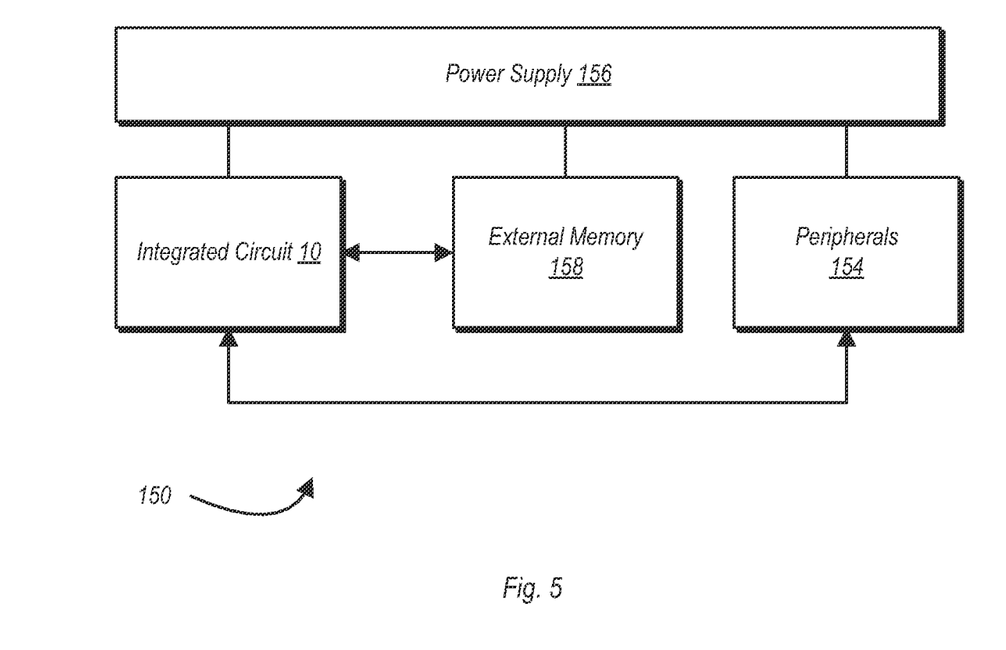
FIG. 5 is a block diagram of one embodiment of an exemplary system.

Turning next to FIG. 5, a block diagram of one embodiment of a system 150 is shown. In the illustrated embodiment, the system 150 includes at least one instance of an IC 5 (e.g., that implements SoC 10 of FIG. 1) coupled to one or more peripherals 154 and an external memory 158. A power supply 156 is also provided which supplies the supply voltages to the IC 10 as well as one or more supply voltages to the memory 158 and/or the peripherals 154. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A method comprising:
   comparing a temperature received from a temperature sensor of an integrated circuit (IC) to a threshold value; and
   reducing a supply voltage provided to the IC by a first voltage guard band amount responsive to determining that the temperature exceeds a first temperature threshold;
   wherein the first temperature threshold is equivalent to a production test temperature plus a temperature sensor guard band;
   wherein the production test temperature is a temperature at which the IC was determined to properly function during a production test; and
   wherein the first voltage guard band is surplus voltage added to a voltage at which the IC was determined to properly function during the production test.

2. The method as recited in claim 1, further comprising operating the IC at a supply voltage that includes the guard band value responsive to determining that the temperature is less than the first temperature threshold.

3. The method as recited in claim 1, further comprising reducing the operating voltage by a portion of the guard band responsive to determining that the temperature is less than the first temperature threshold but greater than a second temperature threshold.

4. An apparatus comprising:
   one or more temperature sensors implemented on an integrated circuit (IC), wherein the IC is configured to receive an operating voltage; and
   a power management unit configured to cause a reduction of the operating voltage by a first guard band amount responsive to determining, based on temperature readings received from the one or more temperature sensors, that a temperature of at least a portion of the IC exceeds a first temperature threshold;
   wherein the first temperature threshold is based on a temperature at which the IC was determined to function properly during a production test; and
   wherein the guard band is a surplus voltage added to a voltage at which the IC was determined to function properly during the production test.

5. The apparatus as recited in claim 4 further comprising an adjustable voltage regulator configured to adjust the operating voltage according to one or more signals received from the power management unit.

6. The apparatus as recited in claim 4, wherein the IC includes a plurality of temperatures sensors, and wherein the power management unit is configured to compare an average of temperatures received from the plurality of temperature sensors to the first temperature threshold.

7. The apparatus as recited in claim 4, wherein the first temperature threshold is a sum of the temperature at which the production test was conducted and a temperature guard band value.

8. A method comprising:
   receiving temperature readings from one or more temperature sensors implemented on an integrated circuit (IC);
   comparing a temperature of at least a portion of the IC based on the one or more temperature readings to at least one temperature threshold;
   responsive to determining that the temperature exceeds the at least one temperature threshold, operating at least a portion of the IC at a voltage that is less than a sum voltage, wherein the sum voltage is a sum of a guard band voltage and a first operating voltage;
   wherein the guard band voltage is a surplus voltage added to a voltage at which the IC was determined to properly function during a production test; and
   wherein the at least one temperature threshold is at least a temperature at which the IC was determined to properly function during the production test.

9. The method as recited in claim 8, further comprising:
   operating the portion of the IC at the sum voltage if the temperature of the IC is less than the at least one temperature threshold; and
   operating the portion of the IC at first operating voltage if the temperature of the IC is greater than the at least one temperature threshold.

10. The method as recited in claim 8, wherein the at least one temperature threshold is a temperature at which the production test was performed plus a guard band temperature.

11. The method as recited in claim 8, further comprising a power management unit of the IC adjusting an operating voltage provided by a voltage regulator based on a temperature determined by the temperature readings.

12. An integrated circuit (IC) comprising:
a first temperature sensor;
a power management unit configured to determine, based on a reading provided by the first temperature sensor, if a temperature of a logic circuit of the IC exceeds a first temperature threshold; and
a voltage regulator, wherein the power management unit is further configured to reduce a voltage output by the voltage regulator by a guard band amount responsive to determining that a temperature of the logic circuit of IC exceeds the first temperature threshold;
wherein the guard band amount is a surplus voltage added to a voltage at which the IC was determined to function properly during a production test;
wherein the first temperature threshold is based on a temperature at which the IC was determined to function properly during the production test.

13. The IC as recited in claim 12, wherein the IC includes a plurality of temperature sensors implemented within the logic circuit, the plurality of temperature sensors including the first temperature sensor, and wherein the power management unit is configured to determine a temperature of the logic circuit based on readings provided by one or more of the plurality of temperature sensors.

14. The IC as recited in claim 13, wherein the power management unit is configured to determine the temperature of the logic circuit based on one of the following:
an average of temperatures reported by the plurality of temperature sensors;
a maximum temperature reported by the plurality of temperature sensors;
a minimum temperature reported by the plurality of temperature sensors.

15. The IC as recited in claim 12, wherein the first temperature sensor is a diode-based temperature sensor.

16. The IC as recited in claim 12, wherein the first temperature sensor is implemented using a ring oscillator.

17. A system comprising:
an integrated circuit (IC) including a logic unit, a plurality of temperature sensors physically distributed throughout the logic unit, and a power management circuit coupled to receive temperature readings from the plurality of temperature sensors;
a power supply coupled to provide a supply voltage to the IC, wherein the IC is configured to operate at an operating voltage based on the supply voltage;
wherein the power management circuit is configured to remove a guard band from the operating voltage responsive to determining that a temperature determined from the temperature readings exceeds a first temperature threshold;
wherein the guard band is a voltage added to a voltage at which the IC was determined to function properly during a production test; and
wherein the first temperature threshold is based on a temperature at which the IC was determined to function properly during the production test.

18. The system as recited in claim 17, wherein the supply voltage and the operating voltage are equivalent, and wherein the power supply is configured to adjust the supply voltage responsive to signals received from the power management circuit.

19. The system as recited in claim 17, wherein the IC includes a voltage regulator coupled to receive the supply voltage from the power supply and is configured to output the operating voltage, wherein the voltage regulator is configured adjust the operating voltage responsive to signals received from the power management circuit.

20. The system as recited in claim 17, wherein the power management circuit is configured to determine an average temperature received from the plurality of temperature sensors and is further configured to compare the average temperature sensor to the first temperature threshold.

21. The system as recited in claim 17, wherein the power management circuit is further configured to reduce the operating voltage by a portion of the guard band responsive to determining that the temperature is less than the first threshold but is greater than a second threshold.

* * * * *